March 7, 1961 J. SCHENCK 2,974,285

GATED AMPLIFIER HAVING DEGENERATIVE FEEDBACK MEANS FOR ELIMINATING TRANSIENTS

Filed Jan. 30, 1957 2 Sheets-Sheet 1

INVENTOR

James Schenck

BY Mason, Fenwick & Lawrence

ATTORNEYS

March 7, 1961 J. SCHENCK 2,974,285

GATED AMPLIFIER HAVING DEGENERATIVE FEEDBACK MEANS FOR ELIMINATING TRANSIENTS

Filed Jan. 30, 1957 2 Sheets-Sheet 2

INVENTOR
James Schenck

BY Mason, Fenwick & Lawrence
ATTORNEYS 2,974,285

GATED AMPLIFIER HAVING DEGENERATIVE FEEDBACK MEANS FOR ELIMINATING TRANSIENTS

James Schenck, Oak Ridge, Tenn.
(119 Commonwealth Ave., Boston 16, Mass.)

Filed Jan. 30, 1957, Ser. No. 637,274

6 Claims. (Cl. 328—91)

The present invention relates in general to electronic switching circuits, and more particularly to gated amplifiers for alternately providing voltages at a common output terminal proportional to each of a plurality of input voltages.

Gated amplifiers, of which an electronic switch is an example, are well-known in the art. The electronic switch conventionally consists of a plurality of gated amplifiers, each of which may be considered to be a circuit designed to provide an output signal that is proportional to an input signal for a specific time interval and then is cut off for a specific period of time, the operation normally being in cyclic fashion. By alternately gating a pair of gated amplifiers on and off, an output signal derived from the pair of gated amplifiers connected to a common output terminal will be proportional to the input signal to one of the amplifiers when that amplifier is on and will be proportional to the inut signal to the other amplifier when the first amplifier is cut off.

Prior art electronic switching circuits have several disadvantages. Usually, the output pulse is not entirely linear with respect to the input, or is only linear over a narrow frequency range. Also, the output contains transients and "pedestals" resulting from the gating of the gated amplifiers making up the switch circuit, and variations of the type generally termed "drift" resulting from changes in the properties of the circuit components. Although extreme care has been exercized to overcome these disadvantages, efforts in this direction have not been successful to the desired degree. Some effects of some of these undesirable factors, particularly the gating transients, are present in the output signal from substantially all known prior art switching circuits.

An object of the present invention, therefore, is the provision of a novel gated amplifier circuit for use in electronic switching circuits and the like which minimizes or obviates the above-mentioned disadvantages.

Another object of the present invention is the provision of a novel gating amplifier circuit for use in electronic switching circuits and the like which provides output pulses which are highly linear with respect to the input.

Another object of the present invention is the provision of a novel gated amplifier circuit for use in electronic switching circuits and the like wherein the output is not affected by transients or drift.

Other objects, advantages and capabilities of the present invention will become apparent from the following detailed description, taken in conjunction with the accompanying drawings illustrating two preferred embodiments of the invention.

Figure 1:
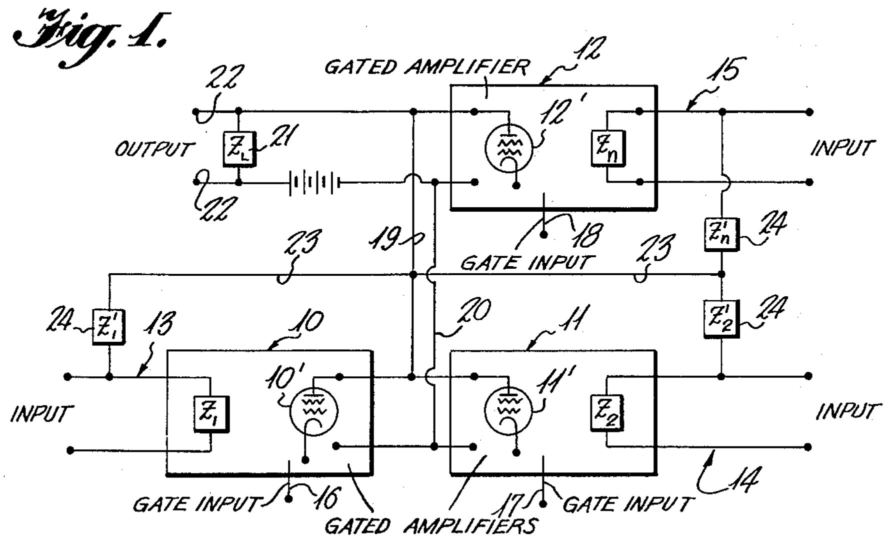
Figure 1 is a schematic illustration of a plurality of gated amplifiers connected to a common load and output terminal, for the purpose of illustrating the general concept of the invention.

The general concept of the invention can be more clearly understood by reference to the diagrammatic illustration of Figure 1, wherein there are *n* gated amplifiers forming a switching circuit, the amplifier 1 being indicated by the reference character 10, the amplifier 2 by the reference character 11, and the amplifier *n* by the reference character 12. Each of the gated amplifiers 10, 11 and 12 is provided with an input network 13, 14 and 15, respectively, and a gate signal input 16, 17 and 18, respectively. The output stages of the amplifiers 10, 11 and 12 indicated schematically at 10', 11' and 12', respectively, are connected in common through leads 19 and 20 to a common load $Z_L$, indicated at 21, having resistive and capacitance components, and to output terminals 22. The amplifiers 10, 11 and 12 are designed to provide a voltage at the output terminals 22 which is proportional to the input voltage of whichever amplifier is rendered operative by the gating signal. Degenerative feedback connections illustrated by the leads 23 and impedances $Z'_1$, $Z'_2$, $Z'_n$ each indicated by the reference character 24, extend from the common output lead 19 to the input networks 13, 14 and 15 of the gated amplifiers, for feeding output pulses back to the inputs at large feedback factors. As an example, if two gated amplifiers such as amplifiers 10 and 11 are connected together and the impedance $Z_1=Z'_1$ and $Z_2=Z'_2$, each of the gated amplifiers will have a gain of two by virtue of the attenuation of the feedback voltage. However, because of the large feedback factor, transients normally occurring in switching circuits at the moment any of the amplifiers are gated on are effectively minimized and the input vs. output functions may be kept identical and stable with respect to both inputs over a very wide frequency range.

Further, by arranging the resistive component of the output load $Z_L$ to be open-circuited when all the gated amplifiers are switched off, allowing the storage of charge on the output capacitance, the circuit may be made to operate as a sample and storage device to hold a constant voltage at the output terminal.

Figure 2:
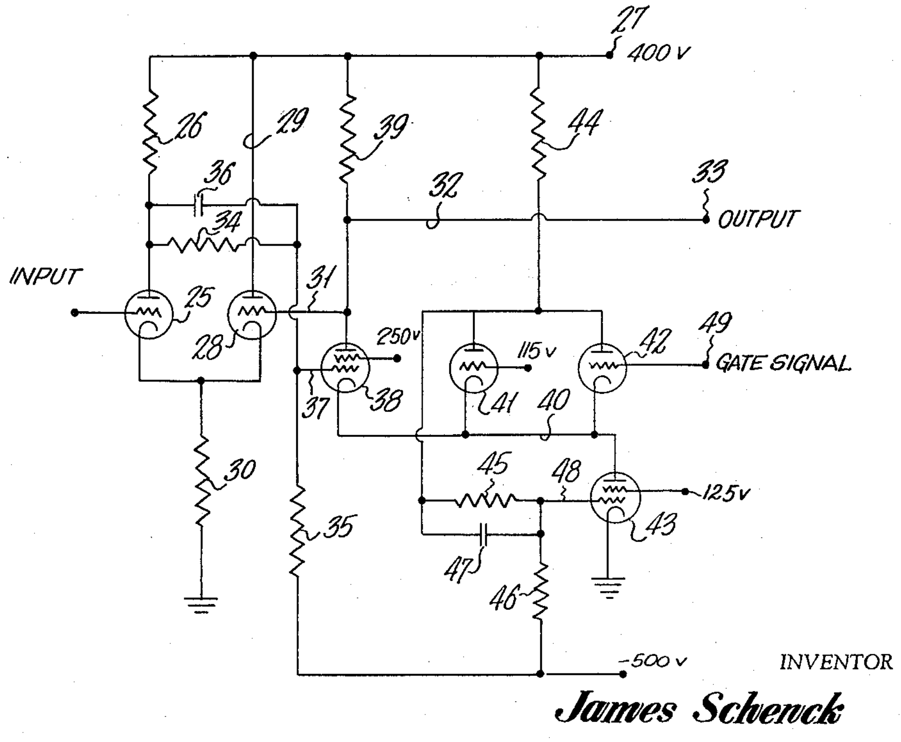
Figure 2 is a schematic diagram of a gated amplifier embodying the present invention.

Referring now to Figure 2 illustrating a preferred circuit for one gated amplifier which may be employed with one or more like circuits to form an electronic switching circuit, the input signal is applied to the grid or a triode tube 25 which may be one section of a 6BQ7A dual triode. The plate of the tube 25 is connected through a plate load resistor 26, which in the preferred embodiment is a 680-ohm resistor, to the B+ terminal 27 which is preferably at about +400 volts. Another triode tube 28 forms a comparator input stage with the triode 25, and to this end the plate of the triode 28 is connected through the lead 29 to the B+ terminal 27 and the cathodes of the triodes 25 and 28 are connected together and through a cathode resistor 30 which is preferably a 300K ohm resistor, to ground. The grid of the triode 28 is connected through grid lead 31 and output lead 32 to the output terminal 33 of the gated amplifier. By virtue of the fact that the input signal is applied to the grid of the tube 25 and the grid of the tube 28 follows the voltage at the output terminal 33, together with a common connection between the cathodes of the tubes 25, 28, the cathodes of the tubes 25, 28 forming the comparator input stage, follow whichever grid is the more positive to prevent the input tube 25 from drawing excessive grid current when the amplifier with which it is associated is gated off if the input voltage applied to the tube 25 is more positive than the input voltage to the amplifier which is gated on.

The signal at the plate of the tube 25 is applied across a voltage divider network formed by the resistors 34 and 35, which are preferably 470K ohm and 1.1M ohm resistors, respectively, which resistors are connected between the plate of the tube 25 and a source of −500 volts. A capacitor 36, preferably of an 18 micromicrofarad capacitor, is connected across the resistor 34, and a portion of the signal applied across the resistors 34, 35, determined by the values of these resistors, is applied through the lead 37 to the control grid of a tetrode tube 38 forming the output tube for the gated amplifier. A constant biasing voltage of about 250 volts is applied to the screen grid of the tetrode tube 38 and the plate of the tube 38 is connected through a plate load resistor 39, preferably a 10K ohm resistor, to the B+ terminal 27. The output lead 32 is also connected directly to the plate of the output tube 38. The tetrode 38 may, for example, be a 6197 tube. To effect the desired gating of the output tube 38, the cathode of the output tube 38 is connected through the lead 40 to the cathodes of two triodes 41 and 42 serving respectively as a bias control tube and a gate signal input tube. The cathode of the output tube 38 is also connected through the lead 40 to the plate of a tetrode 43, which may be a type 6197 tube, the screen grid of the tube 43 being connected to a voltage source of about 125 volts and the cathode of the tube 43 being connected directly to ground. The plates of the triode tubes 41 and 42 are connected together through a common plate load resistor 44, preferably a 15K ohm resistor, to the B+ terminal 27, and through a voltage divider network comprising a 500K ohm resistor 45 and a 1 megohm resistor 46, to −500 volts. A .02 microfarad capacitor 47 is connected across the resistor 45 and the voltage intermediate the resistors 45 and 46 is applied through the grid lead 48 to the control grid of the tetrode tube 43. The gating signal for gating the amplifier on and off, is preferably a substantially square wave signal and is applied at the terminal 49 directly to the control grid of the gate signal input tube 42. The control grid of the triode 41 is connected directly to a constant voltage source of about 115 volts.

In the operation of this circuit, the application of a positive gate pulse to the control grid of the gate signal input tube 42 causes that tube to conduct. The tetrode tube 43 connected between the cathode of the tube 42 and ground serves as a cathode resistance for the tube 42 and these two tubes in conjunction act substantially as a cathode follower circuit. Thus, if the gate signal input tube 42 begins conduction following application of the positive gate pulse thereto, the increased IR drop through the tube 43 causes the cathode of the tube 42 to assume essentially the same potential as its grid. Since the cathodes of output tube 38 and control tube 41 are tied directly to the cathode of the gate signal input tube 42, the cathode potentials of each of these tubes is correspondingly increased, and this increase in the cathode potential of tubes 38 and 41 is sufficient to prevent those tubes from conducting and thereby render this gated amplifier, forming one-half of the electronic switching circuit, inoperable. The exact amplitude of the gate signal is unimportant as long as the extreme positive and negative excursions of the gate signal are positive enough to cut off the output tube 38 and negative enough to cut off the gate signal input tube 42. In the preferred example illustrated, a gating signal alternating between voltage levels of 125 volts and 105 volts has been found satisfactory.

When a negative gate pulse is applied to the control grid of the gate signal input tube 42, it biases the tube 42 out of conduction and the cathodes of the tubes 38, 41 and 42 are held at a fixed potential at low impedance determined by the potential on the grid of the control tube 41. The gated amplifier is, therefore, in operable condition to provide a voltage at its output terminal 33 which is proportional to the voltage applied to the grid of the input tube 25, as the signal applied to the control grid of the tube 25 is applied across the voltage divider network formed by the resistors 34 and 35 to the control grid of the output tube 38. Elimination of the effects of switching transients and the like are avoided, however, by reason of the degenerative feedback introduced by the return of the output signal at the plate of the output tube 38 through the grid lead 31 to the grid of the tube 28 of the cathode-coupled pair of tubes 25, 28. The circuit is so arranged that this feedback voltage is equal to the output voltage so that the over-all amplification of the unit is one. This large feedback factor, which results in a low amplification, has been found to be very effective in eliminating the effects of switching transients to provide good linearity, stability, and wide band width. With two of these gated amplifier circuits connected together in the conventional manner with the outputs from the two gated amplifiers applied through a common lead, an output waveform is obtained which is proportional to the input signals applied to one of the gated amplifiers for the period of time that the negative gating pulse is applied to that amplifier, and is then proportional to the input signals to the second gated amplifier for the period of time that a negative gating pulse is applied to the second amplifier and a positive gating pulse is applied to the first amplifier. The input signals may be either a D.C. voltage, a varying D.C. signal, or an A.C. signal up to approximately 100 megacycles. While the amplifiers are usually intercoupled in a symmetrical circuit, it is not essential that this always be the case.

It is possible to obtain effective gating eliminating the tubes 41, 42 and 43, and substituting for the output tube 38 a pentode whose control grid is coupled into the voltage divider formed by the resistors 34 and 35 in the same manner the tetrode 38 is coupled in the circuit, applying the gating signal directly to the screen grid of the pentode, connecting the suppressor grid of the pentode to a 250-volt bias source, and connecting the cathode directly to a 115-volt source. This will effectively terminate conduction in the pentode during the negative excursions of the gating signal, but has the disadvantage that the positive excursions of the gating signal must be accurately maintained in order not to produce spurious components in the output signal derived directly from the plate of the pentode.

When it is desired to use a circuit of the general type illustrated in Figure 2 as a single gated amplifier and not in common with other gating amplifiers, the comparator input stage formed by the tubes 25 and 28 may be dispensed with and a triode may be intercoupled between the plate of the output tube 38 and the B+ terminal 27 in parallel with the resistors 39 and 44, in which case the cathode of the triode would be connected directly to the plate of the output tube 38, the plate of the triode would be connected through a 1K ohm resistor to the B+ terminal 27, the input signal would be applied directly to the grid of the triode, and the amplified input signal would be coupled from the plate of this triode through an RC network similar to the resistor 34 and capacitor 36 to the control grid of the output tube 38. However, when such a modified circuit is connected in common with similar circuits to form a switching circuit, excessive grid current may be drawn in this input triode of the amplifier which is gated off if its input voltage is more positive than the input voltage of the amplifier which is gated on. This difficulty is overcome by the circuit of Figure 2 where the cathodes of the tubes 25 and 28 follow whichever grid is the more positive.

Figure 3:
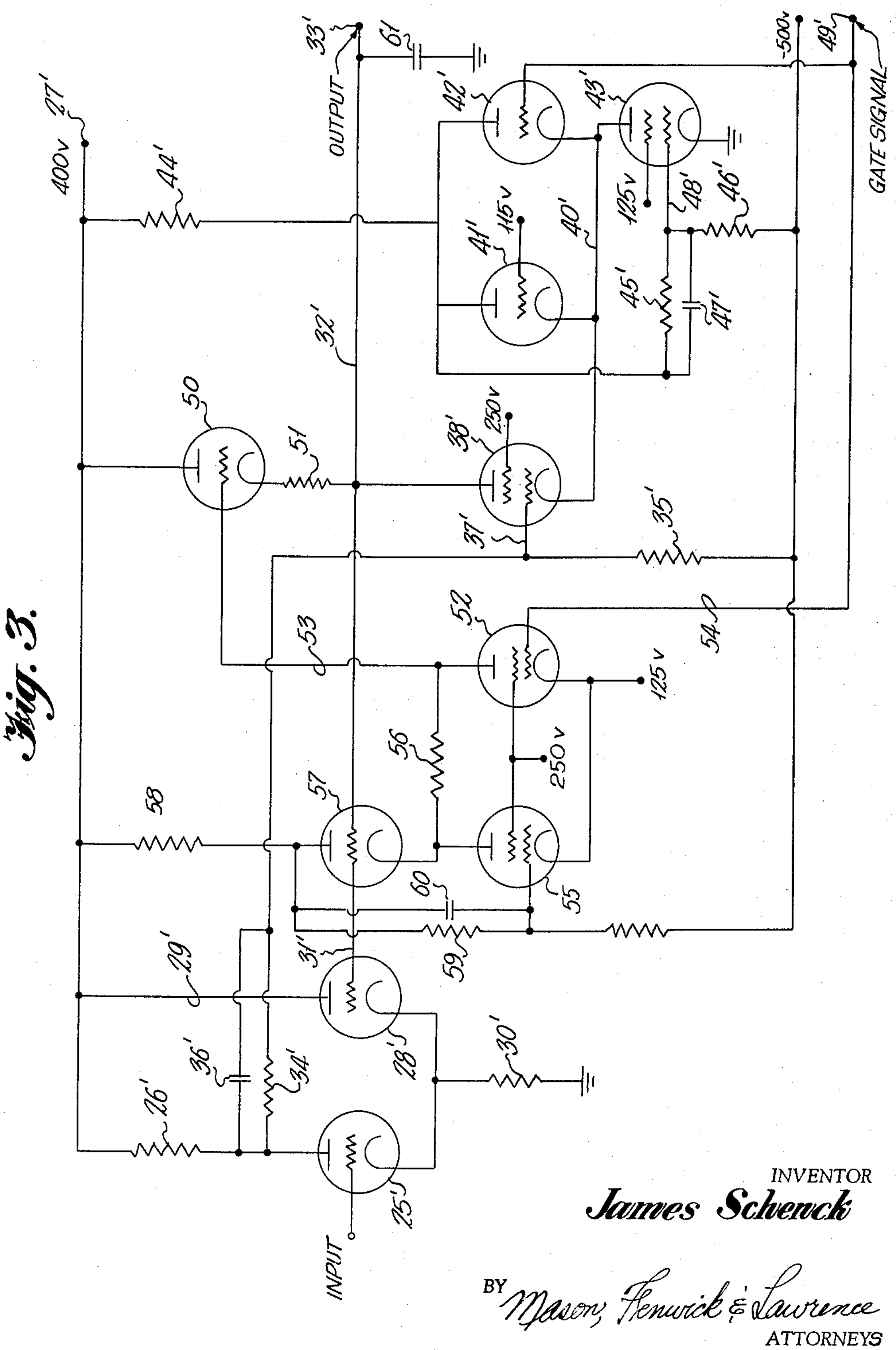
Figure 3 is a schematic diagram of a modified gated amplifier circuit embodying the present invention.

A further modification is shown in Figure 3 which duplicates the circuit of Figure 2 in most respects, the corresponding elements being indicated by reference characters which are the primes of the reference characters of Figure 2, and additionally incorporates elements for holding a constant voltage at the output terminal equal to the input voltage at the moment the amplifier was gated off. The elaboration consists in replacing the output load resistance 39 of Figure 2 which is connected between the B+ terminal 27' and the plate of the output tube 38', with a triode 50 and a small cathode resistor 51, preferably a 100-ohm resistor, for biasing purposes. The plate of the output load triode 50 is connected directly to the B+ terminal 27'. Conduction of the tube 50 is controlled by a gated double cathode follower network comprising a gated tetrode 52 whose plate is connected directly through the lead 53 to the control grid of the triode 50 and whose control grid is connected through the lead 54 to the gate signal input terminal 49'. The cathode of the gated tetrode 52 is interconnected with the cathode of another tetrode 55 and to a constant voltage source of about 125 volts, the screen grids of the tetrodes 52, 55 are connected together to a constant voltage of about 250 volts, and the plates of the tetrodes 52 and 55 are connected together through a 330 ohm resistor 56. The plate of the tetrode 55 is also connected to the cathode of a triode 57 whose control grid is connected in common with the control grid of the feedback tube 28' and to the output terminal 33', and whose plate is connected through a 680 ohm resistor 58 to the B+ terminal 27' and through a 470K ohm resistor 59 and an 18 micromicrofarad capacitor 60 to the control grid of the tetrode 55. A 100 micromicrofarad capacitor 61 is connected between the output terminal 33' and ground and forms the capacitive component of the output load impedance indicated by the reference character 21 in Figure 1 and described in connection with that figure.

With the gate signal, applied to the control grid of the gate signal input tube 42' and the tetrode 52 goes negative, and cuts off these tubes, rendering the gating amplifier in operative condition, the termination of conduction through the tube 52 so reduces the current drawn through 330 ohm resistor 56 as to bias the control grid of the load tube 50 at a voltage maintaining conduction through the load tube 50. The control grid of the load tube 50 is connected through the resistor 56 to the cathode of the tube 57 to which the output voltage is fed back from the output terminal 33'. During the time the grid of the tube 50 follows the output voltage as derived from the interconnected tubes 57 and 55, the load tube 50 serves as an excellent load for the output tube 38'. However, when the gate signal goes positive and terminates conduction in the output tube 38', the tetrode 52 to which the gate signal is also applied is biased into conduction and draws enough current to produce a sufficient voltage drop across the 330 ohm resistor 56 so that the load tube 50 is cut off. Consequently, both the output tube 38' and the output load tube 50 are open-circuited, preventing discharge of the output capacitance 61 and thereby holding constant the voltage at the output terminal 33'.

While several embodiments of the invention have been shown or described, it is apparent that other modifications may be made in the invention without departing from the spirit and scope thereof, and it is desired, therefore, that only such limitations shall be placed thereon as are imposed by the prior art and are set forth in the appended claims.

I claim:

1. A gated amplifier for gating an input signal voltage to produce an output voltage proportional to the input voltage during the period of gating pulses of selected polarity comprising an input amplifier stage for receiving said signal voltage, an output amplifier stage including a vacuum tube having a plate and a control grid, means for coupling the amplified input signal from said input amplifier stage to the grid of said output amplifier stage, degenerative feedback means for applying a feedback signal proportional to the signal at the plate of said output amplifier tube to said input amplifier stage to cancel gating transients from the output of said output amplifier stage, gating means for terminating conduction in said output amplifier tube for the period of said gating pulses to cut off plate current in the output stage, an output load for said output amplifier tube comprising an output load vacuum tube serially connected to the plate of said output amplifier tube and a capacitance connected in parallel with said output load vacuum tube and having a discharge path including said output load vacuum tube, means responsive to said gating pulses for cutting off the plate current of said output load vacuum tube, and means including said output load vacuum tube for open-circuiting the discharge path of said capacitance for preserving substantially a constant charge on the output capacitance during the occurrence of said gating pulses.

2. A gated amplifier for gating an input signal voltage to produce an output voltage proportional to the input voltage for the duration of gating pulses of selected polarity comprising an input amplifier stage for receiving said signal voltage, an output amplifier stage including a vacuum tube having a plate, a cathode and a control grid, means for coupling an amplified version of said input signal voltage from the output of said input amplifier stage to the control grid of said output amplifier tube, a degenerative feedback loop including a feedback triode vacuum tube having a control grid coupled to the plate of said output amplifier tube and a cathode coupled to said input amplifier stage for applying a feedback voltage representing about one-half of the output signal voltage at the plate of said output amplifier tube to said input amplifier stage to cancel gating transients from said output signal voltage, means normally biasing the cathode of said output amplifier tube to place said output amplifier tube in a state of conduction to produce an output signal voltage proportional to said input signal voltage during nonoccurrence of said gating pulses of selected polarity, and gating means responsive to said gating pulses of selected polarity for biasing the cathode of said output amplifier tube to a point cutting off plate current in said output stage for the duration of said gating pulses, said feedback loop including circuit means conditioning said feedback vacuum tube to conduct and bias said input amplifier stage to prevent flow of excessive grid current therein upon application of input signals of selected positive values to said input amplifier stage.

3. A gated amplifier for gating an input signal voltage to produce an output voltage proportional to the input voltage for the duration of gating pulses of selected polarity comprising an input amplifier stage for receiving said signal voltage, an output amplifier stage including a vacuum tube having a plate, a cathode and a control grid, means for coupling an amplified version of said input signal voltage from the output of said input amplifier stage to the control grid of said output amplifier tube, a degenerative feedback loop for applying a feedback voltage representing about one-half of the output signal voltage at the plate of said output amplifier tube to said input amplifier stage to cancel gating transients from said output signal voltage, means normally biasing the cathode of said output amplifier tube to place said output amplifier tube in a state of conduction to produce an output signal voltage proportional to said input signal voltage during nonoccurrence of said gating pulses of selected polarity, gating means responsive to said gating pulses of selected polarity for biasing the cathode of said output amplifier tube to a point cutting off plate current in said output stage for the duration of said gating pulses, an output load for said output amplifier tube comprising an output load vacuum tube serially connected to the plate of said output amplifier tube and a capacitance connected in parallel with said output load vacuum tube and having a discharge path including said output load vacuum tube, an output terminal connected to the plate of said output amplifier tube and to said capacitance, and means responsive to said gating pulses of selected polarity for cutting off conduction of said output load vacuum tube for the duration of gating pulses to open-circuit the discharge path of said capacitance during the period that said output amplifier tube is non-conducting for preserving substantially a constant charge on said output capacitance and holding the voltage at said output terminal constant.

4. A gated amplifier for a switching circuit of the type having a plurality of such gated amplifiers for gating an input signal voltage to produce an output voltage at a common output terminal for all the gated amplifiers proportional to the input voltage to said gated amplifiers during the period of gating pulses of selected polarity applied thereto, the gated amplifier comprising an input amplifier stage for receiving said signal voltage, an output amplifier stage including a vacuum tube having a plate and a control grid, means coupling the plate of said output amplifier stage to the common output terminal, means for coupling the amplified input signal from said input amplifier stage to the grid of said output amplifier stage, a degenerative feedback loop including a vacuum tube stage for applying a feedback signal proportional to the signal at the plate of said output amplifier tube through said feedback vacuum tube stage to said input amplifier stage to cancel gating transients from the output of said output amplifier stage, gating means for terminating conduction in said output amplifier stage for the period of said gating pulses to cut off plate current in said output stage, and means interconnecting said feedback vacuum tube stage to said input stage and said plate of said output stage to prevent flow of excessive grid current in said input stage in response to a more positive signal on its grid than on the grid of any other amplifier input stage when its associated gated amplifier is cut off.

5. A gated amplifier for a switching circuit of the type having a plurality of such gated amplifiers each arranged to gate an input signal voltage applied thereto to produce an output voltage proportional to the input voltage during the period of gating pulses of selected polarity applied thereto, the gated amplifier comprising an input triode vacuum tube having the input signal applied to the control grid thereof, an output stage including a vacuum tube having a plate and a control grid, means for coupling the signal at the plate of said input triode vacuum tube to the control grid of said output stage vacuum tube, means for coupling the signal at the plate of said output stage vacuum tube to a common output terminal for all of the gated amplifiers of the switching circuit, degenerative feedback loop means including a feedback triode vacuum tube having its cathode coupled directly to the cathode of said input triode vacuum tube and having a common cathode resistor with said input triode vacuum tube and circuit means for applying a feedback signal proportional to the signal at the plate of said output stage vacuum tube to the control grid of said feedback vacuum tube to provide a degenerative feedback signal at the cathode of said input vacuum tube to cancel gating transients from the output of said output stage, and gating means for terminating conduction in said output stage vacuum tube for the period of said gating pulses to terminate conduction in said output amplifier stage.

6. A switching circuit comprising a plurality of gated amplifiers having a common output terminal for successively producing at said common output terminal voltages proportional to input voltages applied to each of said gated amplifiers for the period during which gating pulses of selected polarity are applied to said gated amplifiers, each of said gated amplifiers comprising an input triode vacuum tube having the input voltage applied to the control grid thereof, an output stage including a vacuum tube having a plate and a control grid, means for coupling the signal at the plate of said input triode vacuum tube to the control grid of said output stage vacuum tube, means for coupling the signal at the plate of said output stage vacuum tube to the common output terminal for all of the gated amplifiers of the switching circuit, degenerative feedback loop means including a feedback triode vacuum tube having its cathode coupled directly to the cathode of said input triode vacuum tube and having a common cathode resistor with said input triode vacuum tube and circuit means for applying a feedback signal proportional to the signal at the plate of said output stage vacuum tube to the control grid of said feedback vacuum tube to provide a degenerative feedback signal at the cathode of said input vacuum tube to cancel gating transients from the output of said output stage, and gating means for terminating conduction in said output stage vacuum tube for the period of said gating pulses to gate the output amplifier stage to an off condition.

References Cited in the file of this patent

UNITED STATES PATENTS

| | | |
|---|---|---|
| 2,572,792 | White | Oct. 23, 1951 |
| 2,719,225 | Morris | Sept. 27, 1955 |
| 2,775,696 | Thomas | Dec. 25, 1956 |